(12) United States Patent
Sasaki et al.

(10) Patent No.: US 7,648,814 B2
(45) Date of Patent: Jan. 19, 2010

(54) BLACK PASTE COMPOSITION, METHOD OF FORMING BLACK MATRIX PATTERN BY USING THE SAME, AND THE BLACK MATRIX PATTERN FORMED

(75) Inventors: Masaki Sasaki, Hiki-gun (JP); Kenji Kato, Hiki-gun (JP); Masao Arima, Hiki-gun (JP)

(73) Assignee: Taiyo Ink Mfg. Co., Ltd., Tokyo (JP)

( * ) Notice: Subject to any disclaimer, the term of this patent is extended or adjusted under 35 U.S.C. 154(b) by 158 days.

(21) Appl. No.: 12/013,009

(22) Filed: Jan. 11, 2008

(65) Prior Publication Data

US 2008/0118864 A1    May 22, 2008

Related U.S. Application Data

(63) Continuation of application No. PCT/JP2006/313890, filed on Jul. 12, 2006.

(30) Foreign Application Priority Data

Jul. 13, 2005    (JP)    ............... 2005-204089

(51) Int. Cl.
  *G03F 7/004*    (2006.01)
  *H01J 9/227*    (2006.01)
  *H01J 17/49*    (2006.01)

(52) U.S. Cl. ............ 430/198; 430/281.1; 430/286.1; 430/319; 430/321; 430/945; 313/582

(58) Field of Classification Search ............... None
  See application file for complete search history.

(56) References Cited

U.S. PATENT DOCUMENTS 5,972,564 A    10/1999   Kawana et al.

2004/0259452 A1*  12/2004  Matsumoto et al. ......... 445/24
2006/0181208 A1*  8/2006   Jeon ........................ 313/582

FOREIGN PATENT DOCUMENTS

| JP | 10-269848 A | 10/1998 |
| JP | 11-317112 A | 11/1999 |
| JP | 2002-351071 | 12/2002 |
| JP | 2002-351072 | 12/2002 |
| JP | 2003-187692 | 7/2003 |
| JP | 2003-280193 A | 10/2003 |
| JP | 2004-198444 A | 7/2004 |
| JP | 2004-45596 | 12/2004 |
| KR | 10-2004-0007700 | 1/2004 |
| WO | WO 2007/063816 A1 | 6/2007 |

* cited by examiner

*Primary Examiner*—John A. McPherson
(74) *Attorney, Agent, or Firm*—Oblon, Spivak, McClelland, Maier & Neustadt, L.L.P.

(57) ABSTRACT

An object of the present invention is to provide a black paste composition suitable for use in laser direct imaging devices employing a light source emitting a laser having a maximum wavelength of 350 to 420 nm, useful in forming a high-definition black matrix pattern efficiently, and superior in storage stability, a black matrix pattern formed by using the composition, a plasma display having the pattern, and a method of forming the black matrix pattern by using the composition. An alkali development-type black paste composition of the present invention comprises (A) a carboxyl group-containing resin, (B) a glass frit, (C) a black pigment, (D) a compound having at least one radically polymerizable unsaturated group in its molecule, and (E-1) an oxime-based photopolymerization initiator represented by the following general formula (I).

16 Claims, No Drawings

BLACK PASTE COMPOSITION, METHOD OF FORMING BLACK MATRIX PATTERN BY USING THE SAME, AND THE BLACK MATRIX PATTERN FORMED

CROSS REFERENCE TO RELATED APPLICATIONS

This is a Continuation Application of PCT Application No. PCT/JP2006/313890, filed Jul. 12, 2006, which was published under PCT Article 21(2) in Japanese.

This application is based upon and claims the benefit of priority from prior Japanese Patent Application No. 2005-204089, filed Jul. 13, 2005, the entire contents of which are incorporated herein by reference.

BACKGROUND OF THE INVENTION

1. Field of the Invention

The present invention relates to a black paste composition suitable for formation of various black matrix patterns, a method of forming the black matrix pattern by using the composition, and the black matrix pattern formed. Specifically, the invention relates to a black paste composition suitable for a laser direct imaging device employing a light source emitting a laser having a maximum wavelength of 350 to 420 nm that is useful in forming a high-definition black matrix pattern efficiently and superior in storage stability, a method of forming the black matrix pattern by using the composition, and the black matrix pattern formed.

2. Description of the Related Art

Conventionally, a black matrix pattern is formed on a front substrate for flat display device. As for the method of forming the black matrix pattern, a black matrix pattern is formed on a glass substrate as it is tightly bound, for example, by preparing a coating film by coating and drying a resist for a black matrix pattern on a glass plate, exposing an image on the coating film through a photomask carrying a circuit or an electrode pattern drawn thereon, forming a resist layer corresponding to the circuit or the electrode pattern by development with an aqueous alkaline solution while utilizing the difference in solubility of the exposed and unexposed regions in the developing solution, and baking the black matrix pattern bonded onto the glass plate.

However, by the pattern exposure methods, there were occasionally some defects in the photomask, leading to defects in the formed pattern and positional fluctuation of the photomask or the glass plate because of expansion and shrinkage thereof, and thus, it was difficult to perform pattern exposure of thin line and particularly to decrease the defective rate in production of large panels. In addition, preparation of the photomask requires significant time and cost, and thus, increased cost for preparation of the photomask particularly, for example, in large-item small-scale production or prototype production raised a concern.

For this reason, a laser direct imaging (LDI) method of drawing an image of a circuit prepared by computer-aided design (CAD) directly with a laser beam is attracting attention. The LDI method, which draws a pattern directly from CAD data, allows efficient large-item small-scale production, and also has many advantages such as accurate positioning without use of the photomask, easier correction of scaling, and absence of the need for controlling deposition of foreign matter, staining, and scratching on the photomask.

However, disadvantageously because an image is drawn directly by laser scanning during LDI, the tact time became longer than when an image is formed all at once by exposure through a photomask, and thus, the throughput was still insufficient. For improvement of the throughput, it is necessary to raise the laser scanning speed, but unfortunately, conventional photosensitive black paste compositions were insufficient in sensitivity (desirable exposure intensity: 300 to 500 mJ/cm$^2$), making it difficult to raise the scanning speed.

On the other hand, a composition containing a particular dye sensitizing agent, a titanocene compound and the like (see, for example, Patent Documents 1 and 2), and a laser-photosensitive composition containing a particular bisacylphosphine oxide (see, for example, Patent Document 3) were proposed as the compositions compatible with laser scanning, but they were still unsatisfactory in photoimaging velocity.

Patent Document 1: Jpn. Pat. Appln. KOKAI Publication No. 2002-351071 (claims)

Patent Document 2: Jpn. Pat. Appln. KOKAI Publication No. 2002-351072 (claims)

Patent Document 3: Jpn. Pat. Appln. KOKAI Publication No. 2004-45596 (claims)

BRIEF SUMMARY OF THE INVENTION

Problems to be Solved

A main object of the present invention, which has been made to solve the problems above, is to provide a black paste composition suitable for use in laser direct imaging devices employing a light source emitting a laser having a maximum wavelength of 350 to 420 nm, useful in forming a high-definition black matrix pattern efficiently, and superior in storage stability, a method of forming the black matrix pattern by using the composition, and the black matrix pattern formed.

Means for Solving the Problems

After intensive studies to achieve the object above, the inventors have found that a black paste composition containing a carboxyl group-containing resin (A), a glass frit (B), a black pigment (C), a compound (D) having at least one radically polymerizable unsaturated group in its molecule, and an oxime-based photopolymerization initiator (E-1) represented by general formula I, below, had superior photohardening efficiency to light sources emitting a laser having a maximum wavelength of 350 to 420 nm, and completed the present invention:

[Formula 1]

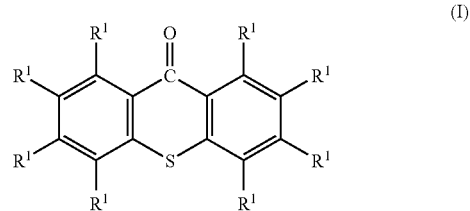

wherein one or two R$^1$s are represented by the following general formula (II), and each of the other R$^1$s represents a hydrogen or halogen atom or a methyl, ethyl, or phenyl group;

[Formula 2]

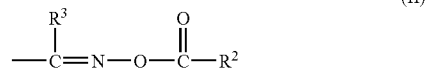

wherein R$^2$ represents a hydrogen atom, an alkyl group having 1 to 6 carbon atoms, or a phenyl group; and R$^3$ represents a hydrogen atom or an alkyl group having 1 to 6 carbon atoms.

In another aspect of the invention, there are provided a method of forming a black matrix pattern, including:

a step (1) of drawing a pattern by using a light source emitting a laser having a maximum wavelength of 350 to 420 nm;

a step (2) of forming a pattern selectively by developing the pattern with a dilute aqueous alkaline solution; and a step (3) of baking the pattern at 400 to 600° C., and the black matrix pattern formed by the above method.

ADVANTAGES OF THE INVENTION

The black paste composition according to the present invention, which shows superior photohardening efficiency to light sources emitting a laser having a maximum wavelength of 350 to 420 nm, allows use of a laser direct imaging device as the exposure device, and eliminates the positional fluctuation by expansion and shrinkage of the photomask or the glass plate and the pattern defects by deposition of foreign matter on the photomask that are found in conventional exposure methods, thus allowing formation of a highly reliable black matrix pattern.

In addition, the use of a laser direct imaging device eliminates the need for a photomask and allows easier transition from designing to production and reduction of defective rate and production cost.

DETAILED DESCRIPTION OF THE INVENTION

The black paste composition according to the present invention contains a carboxyl group-containing resin (A), a glass frit (B), a black pigment (C), a compound (D) containing at least one radically polymerizable unsaturated group in its molecule, and an oxime-based photopolymerization initiator (E-1) represented by general formula I, below, and is highly photohardenable to light sources emitting a laser having a maximum wavelength of 350 to 420 nm.

In another favorable aspect, there is provided a black paste composition containing a phosphine oxide-based polymerization initiator (E-2) containing a structure represented by general formula (III), below, in addition to the composition above.

Provided as yet another favorable aspect is a composition superior in storage stability obtained by blending boric acid (F) and/or a phosphorus compound (G) containing a structure represented by formula (IV) or (V), below, to the composition above.

Hereinafter, the respective components in the black paste composition according to the present invention will be described in detail.

Any known resin compound containing one or more carboxyl groups in its molecule may be used as the carboxyl group-containing resin (A) contained in the black paste composition according to the present invention. A carboxyl group-containing photosensitive resin (A') having radically polymerizable unsaturated double bonds in its molecule is more preferable, from the viewpoints of photohardening efficiency and development resistance.

Specific examples thereof include, but are not limited to, the following resins:

(1) Carboxyl group-containing resins obtained by copolymerization of an unsaturated carboxylic acid such as (meth)acrylic acid with one or more of other compounds having an unsaturated double bond;

(2) Carboxyl group-containing photosensitive resins obtained by adding ethylenic unsaturated groups as pendants to a copolymer of an unsaturated carboxylic acid such as (meth)acrylic acid and one or more of other compounds having an unsaturated double bond, with a compound having an epoxy group and an unsaturated double bond such as glycidyl (meth)acrylate or 3,4-epoxycyclohexylmethyl (meth)acrylate or (meth)acrylic chloride;

(3) Carboxyl group-containing photosensitive resins obtained by allowing an unsaturated carboxylic acid such as (meth)acrylic acid to react with a copolymer of a compound having an epoxy group and an unsaturated double bond such as glycidyl (meth)acrylate or 3,4-epoxycyclohexylmethyl (meth)acrylate and another compound having an unsaturated double bond and then, a polybasic acid anhydride to react with the generated secondary hydroxyl group;

(4) Carboxyl group-containing photosensitive resins obtained by allowing a compound having a hydroxyl group and an unsaturated double bond such as 2-hydroxyethyl (meth)acrylate to react with a copolymer of an acid anhydride having an unsaturated double bond such as maleic anhydride and another compound having an unsaturated double bond;

(5) Carboxyl group-containing photosensitive resins obtained by allowing a multifunctional epoxy compound to react with an unsaturated monocarboxylic acid and then a saturated or unsaturated polybasic acid anhydride with the generated hydroxyl group;

(6) Hydroxyl and carboxyl group-containing photosensitive resins obtained by allowing a saturated or unsaturated polybasic acid anhydride to react with a hydroxyl group-containing polymer such as polyvinylalcohol derivative and then a compound having an epoxy group and an unsaturated double bond in its molecule with the generated carboxylic acid;

(7) Carboxyl group-containing photosensitive resins obtained by allowing a saturated or unsaturated polybasic acid anhydride to react with a reaction product from a multifunctional epoxy compound, an unsaturated monocarboxylic acid, and a compound having at least one alcoholic hydroxyl group in its molecule and a group reactive with epoxy group, other than alcoholic hydroxyl group;

(8) Carboxyl group-containing photosensitive resins obtained by allowing an unsaturated monocarboxylic acid to react with a multifunctional oxetane compound having at least two oxetane rings in its molecule and a saturated or unsaturated polybasic acid anhydride with the primary hydroxyl groups in the obtained modified oxetane resin; and (9) Carboxyl group-containing photosensitive resins obtained by allowing a unsaturated monocarboxylic acid with a multifunctional epoxy resin and then a polybasic acid anhydride with the product, and additionally allowing a compound having an oxirane ring and one or more ethylenic unsaturated groups in its molecule with the carboxyl group-containing resin obtained.

Among these exemplary resins, carboxyl group-containing photosensitive resins 2 and 3 are preferable, from the viewpoints of photohardening and baking efficiencies.

In the present description, (meth)acrylate is a generic term including acrylate, methacrylate and the mixture thereof, and the other similar terms also mean similarly.

Such a carboxyl group-containing resin (A), which has multiple free carboxyl groups on the side chains of the backbone polymer, permits development with a dilute aqueous alkaline solution.

The acid value of the carboxyl group-containing resin (A) is preferably in the range of 40 to 200 mg-KOH/g, more preferably in the range of 45 to 120 mg-KOH/g. An acid value of the carboxyl group-containing resin at less than 40 mg-KOH/g disadvantageously makes alkali development difficult, while an acid value of more than 200 mg-KOH/g disadvantageously leads to undesirable line thinning due to excessive solubilization of the exposed region by the developing solution and occasionally unselective solubilization and removal of both exposed and unexposed regions by the developing solution, making it difficult to draw a resist pattern normally.

The weight-average molecular weight of the carboxyl group-containing resin (A) may vary according to the resin skeleton, but is generally in the range of 2,000 to 150,000, preferably 5,000 to 100,000. A resin having a weight-average molecular weight of less than 2,000 may result in deterioration in tack-free property and also in moisture resistance of the coated film after exposure, disadvantageously leading to thinning of the film and deterioration in resolution during development. On the other hand, a resin having a weight-average molecular weight of more than 150,000 may lead to drastic deterioration in development efficiency and also to unfavorable storage stability.

The compounding ratio of the carboxyl group-containing resin (A) is preferably 10 to 80 mass %, more preferably 15 to 50 mass %, in the entire composition. A compounding ratio below the range above may unfavorably lead to deterioration in the strength of the coated film. On the other hand, a compounding ratio above the range may unfavorably lead to increase in viscosity, deterioration in coating property, or the like.

The glass frit (B) for use in the black paste composition according to the present invention is favorably a low-melting point glass frit having a softening point of 300 to 600° C. that favorably contains lead oxide, bismuth oxide, or zinc oxide as the principal component. A glass frit (B) having an average particle diameter of 20 μm or less, preferably 5 μm or less, is used favorably, from the viewpoint of resolution. Favorable examples of the glass powder containing lead oxide as the principal component include a noncrystalline frit having a composition of 48 to 82% PbO, 0.5 to 22% $B_2O_3$, 3 to 32% $SiO_2$, 0 to 12% $Al_2O_3$, 0 to 10% BaO, 0 to 15% ZnO, 0 to 2.5% $TiO_2$, and 0 to 25% $Bi_2O_3$ (where % represents percentage oxide mass) and having a softening point of 420 to 590° C.

Favorable examples of the glass powder containing bismuth oxide as the principal component include a noncrystalline frit having a composition of 35 to 88% $Bi_2O_3$, 5 to 30% $B_2O_3$, 0 to 20% $SiO_2$, 0 to 5% $Al_2O_3$, 1 to 25% BaO, and 1 to 20% ZnO (where % represents percentage oxide mass) and having a softening point of 420 to 590° C.

Favorable examples of the glass powder containing zinc oxide as the principal component include a noncrystalline frit having a composition of 25 to 60% ZnO, 2 to 15% $K_2O$, 25 to 45% $B_2O_3$, 1 to 7% $SiO_2$, 0 to 10% $Al_2O_3$, 0 to 20% BaO, and 0 to 10% MgO (where % represents percentage oxide mass) and having a softening point of 420 to 590° C.

The black pigment (C) for use in the black paste composition according to the present invention is favorably a single metal oxide such as of Cu, Fe, Cr, Mn, Co, Ru, or La and/or a composite metal oxide of two or more of these elements, and the average particle diameter thereof is preferably 10 μm or less, more preferably 2.5 μm or less from the viewpoint of resolution. Alternatively, the average particle diameter is 1.0 μm or less, preferably 0.6 μm or less, from the viewpoint of blackness.

Among the black pigments above, use of tricobalt tetroxide ($CO_3O_4$) fine particles having a specific surface area in the range of 1.0 to 20 $m^2/g$ is particularly preferable. This is because a specific surface area of less than 1.0 $m^2/g$ leads to deterioration in the pattern forming precision by exposure and also in the linearity of line edge, prohibiting production of a sufficiently black baked film. On the other hand, a specific surface area of more than 20 $m^2/g$ leads to excessive increase in the particle surface area, causing undercut easily during development.

The blending rate of the black pigment (C) is preferably in the range of 10 to 100 parts by mass with respect to 100 parts by mass of the glass frit (B). A blending rate of lower than the above range is unfavorable, because it leads to insufficient blackness after baking. On the other hand, a blending rate above the range is also unfavorable, because it leads to deterioration in light transmission, easily causing undercut.

Examples of the compound (D) having at least one radically polymerizable unsaturated group in its molecule for use in the present invention include hydroxyalkyl acrylates such as 2-hydroxyethyl acrylate, 2-hydroxypropyl acrylate, pentaerythritol triacrylate, and dipentaerythritol pentaacrylate; glycol mono- or di-acrylates such as ethylene glycol, methoxytetraethylene glycol, polyethylene glycol, and propylene glycol; acrylamides such as N, N-dimethylacrylamide, N-methylolacrylamide, and N, N-dimethylaminopropylacrylamide; aminoalkyl acrylates such as N, N-dimethylaminoethyl acrylate and N, N-dimethylaminopropyl acrylate; polyvalent alcohols such as hexanediol, trimethylolpropane, pentaerythritol, dipentaerythritol, and tris-hydroxyethyl isocyanurate or polyvalent acrylates such as the ethyleneoxide or propyleneoxide adducts thereof; acrylates such as phenoxy acrylate, bisphenol A diacrylate, and the ethyleneoxide or propyleneoxide adducts of these phenols; glycidyl ether acrylates such as glycerol diglycidyl ether, glycerol triglycidyl ether, trimethylolpropane triglycidyl ether, and triglycidyl isocyanurate; multifunctional or monofunctional polyurethane acrylates and melamine acrylates, which are the hydroxyalkyl acrylates modified with isocyanate, and/or the methacrylates corresponding to the acrylates, and these compounds may be used alone or in combination of two or more. Among them, compounds having at least two or more radically polymerizable unsaturated groups in its molecule such as pentaerythritol triacrylate and dipentaerythritol hexaacrylate are preferable, because they are superior in photohardening efficiency.

Hereinafter, the compound may be referred to as a polymerizable monomer.

The compounding ratio of the polymerizable monomer (D) is preferably 5 to 100 parts by mass, more preferably, 10 to 70 parts by mass, with respect to 100 parts by mass of the carboxyl group-containing resin (A). Unfavorably when the compounding ratio is less than 5 parts by mass, photohardening efficiency decreases, and it becomes difficult to form a pattern by alkali development after high-energy ray irradiation. On the other hand, when it is more than 100 parts by mass, the composition unfavorably becomes less soluble in aqueous alkaline solution, and the coated film brittler.

The oxime-based photopolymerization initiator (E-1) for use in the black paste composition according to the present invention must be an oxime-based photopolymerization initiator represented by the following general formula (I):

[Formula 3]

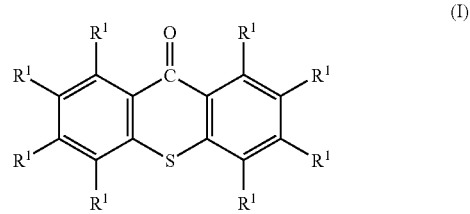

(wherein one or two groups $R^1$s are represented by the following general formula [II], and each of the other groups $R^1$s represents a hydrogen or halogen atom or a methyl, ethyl, or phenyl group),

[Formula 4]

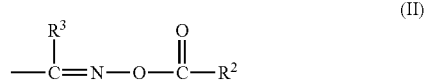

(wherein $R^2$ represents a hydrogen atom, an alkyl group having 1 to 6 carbon atoms, or a phenyl group; and $R^3$ represents a hydrogen atom or an alkyl group having 1 to 6 carbon atoms), for use as silver paste composition for LDI.

An example of the compound is 2-(acetyloxyiminomethyl)thioxanthen-9-one represented by the following formula (VI):

[Formula 5]

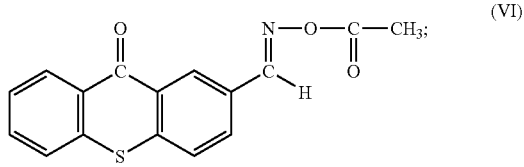

and examples of the commercial products include CGI-325 manufactured by Ciba Specialty Chemicals.

Another oxime-based photopolymerization initiator, such as 1-[4-(phenylthio)-2-(O-benzoyloxime)]-1,2-octandione, (trade name: Irgacure-OXE01, manufactured by Ciba Specialty Chemicals) or 1-[9-ethyl-6-(2-methylbenzoyl)-9H-carbazol-3-yl]-, 1-(O-acetyloxime)-ethanone (trade name: Irgacure OXE02, manufactured by Ciba Specialty Chemicals), may be used in combination as needed.

The compounding ratio of the oxime-based photopolymerization initiator (E-1) is preferably 0.01 to 20 parts by mass, more preferably 0.01 to 5 parts by mass, with respect to 100 parts by mass of the carboxyl group-containing resin (A). An oxime-based photopolymerization initiator (E-1) compounding ratio of less than 0.01 with respect to 100 parts by mass of the carboxyl group-containing resin (A) is unfavorable, because it is not possible to obtain favorable photohardening efficiency. Alternatively, a compounding ratio of more than 20 parts by mass unfavorably leads to deterioration in thick-film hardening efficiency and increase in production cost.

The black paste composition according to the present invention preferably contains additionally a phosphine oxide-based photopolymerization initiator (E-2) having a structure represented by the following general formula (III):

[Formula 6]

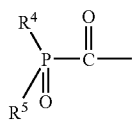

In general formula (III), $R^4$ and $R^5$ each independently represent a linear or branched alkyl group having 1 to 6 carbon atoms, a cyclohexyl group, a cyclopentyl group, an aryl group, a halogen atom, an aryl group substituted with alkyl or alkoxy groups, or a carbonyl group having 1 to 20 carbon atoms, with the proviso that $R^4$ and $R^5$ are not carbonyl groups having 1 to 20 carbon atoms at the same time.

Examples of the phosphine oxide-based photopolymerization initiator (E-2) include 2,4,6-trimethylbenzoyldiphenylphosphine oxide, bis(2-4,6-trimethylbenzoyl)-phenylphosphine oxide, and bis(2,6-dimethoxybenzoyl)-2-4,4-trimethyl-pentylphosphine oxide.

The compounding ratio of the phosphine oxide-based photopolymerization initiator (E-2) is preferably 60 parts or less by mass, more preferably 50 parts or less by mass, with respect to 100 parts by mass of the carboxyl group-containing resin (A). A compounding ratio of the phosphine oxide-based photopolymerization initiator (E-2) at more than 60 parts by mass is unfavorable, because it leads to deterioration in thick-film hardening efficiency and increase in production cost.

The compounding ratio of the oxime-based photopolymerization initiator (E-1) represented by general formula (I), is preferably smaller than the compounding ratio of the phosphine oxide-based photopolymerization initiator (E-2) represented by general formula (III), for obtaining highly sensitive thick-film hardening efficiency.

The black paste composition according to the present invention may contain additionally, as needed, one or more of common known photopolymerization initiators, and examples thereof include benzoin and benzoin alkylethers such as benzoin, benzoin methyl ether, benzoin ethyl ether, and benzoin isopropyl ether; acetophenones such as acetophenone, 2,2-dimethoxy-2-phenylacetophenone, 2,2-diethoxy-2-phenylacetophenone, 2,2-diethoxy-2-phenylacetophenone, and 1,1-dichloroacetophenone; aminoacetophenones such as 2-methyl-1-[4-(methylthio)phenyl]-2-morpholinopropan-1-one and 2-benzyl-2-dimethylamino-1-(4-morpholino phenyl)-butanone-1; anthraquinones such as 2-methylanthraquinone, 2-ethylanthraquinone, 2-tertiary-butylanthraquinone, and 1-chloroanthraquinone; thioxanthones such as 2,4-dimethylthioxanthone, 2,4-diethylthioxanthone, 2-chlorothioxanthone, and 2,4-diisopropylthioxanthone; ketals such as acetophenone dimethylketal and benzyldimethylketal; benzophenones such as benzophenone; or xanthones; phosphine oxides such as (2,6-dimethoxybenzoyl)-2,4,4-pentylphosphine oxide, bis(2,4,6-trimethylbenzoyl)-phenylphosphine oxide, 2,4,6-trimethylbenzoyldiphenylphosphine oxide, and ethyl-2,4,6-trimethylbenzoylphenylphosphine oxide; and the like. In particular, combined use of thioxanthone-based photopolymerization initiators such as 2,4-dimethylthioxanthone, 2,4-diethylthioxanthone, 2-chlorothioxanthone, and 2,4-diisopropylthioxanthone is preferable from the viewpoint of in-depth hardening efficiency.

The black paste composition according to the present invention preferably contains boric acid (F) additionally for improvement in storage stability.

The boric acid (F) preferably has an average particle diameter (D50) of preferably 20 μm or less, more preferably 5 μm or less, as it is pulverized, for example, in a jet mill, ball mill, roll mill or the like. Such a fine powder is hygroscopic and aggregates easily, and thus, is preferably used promptly after pulverization. The boric acid may be pulverized with the resin, solvent and others contained in the paste.

The compounding ratio of the boric acid (F) is preferably 0.01 to 10 parts by mass, more preferably, 0.1 to 2 parts by mass, with respect to 100 parts by mass of the glass frit (B). A boric acid compounding ratio of less than 0.01 part by mass with respect to 100 parts by mass of the glass frit (B) unfavorably results in no improvement in storage stability.

When the boric acid (F) is added, preferable is use of a hydrophobic solvent having a solubility in 100 g of water at 25° C. of 20 g or less. Use of an organic solvent having higher water solubility is unfavorable, because water dissolved in the organic solvent may ionize the metal contained in the glass frit, possibly leading to gelling of the solution.

In addition, the black paste composition according to the present invention preferably contains, for improvement in storage stability, a phosphorus compound (G) having the structure represented by either of the following formulae (IV) and (V):

[Formula 7]

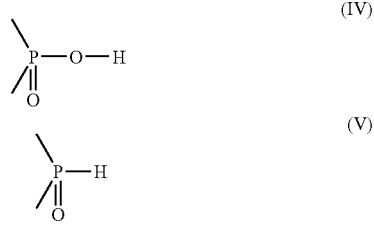

Examples of the phosphorus compound (G) include methyl phosphate, ethyl phosphate, propyl phosphate, butyl phosphate, phenyl phosphate, dimethyl phosphate, diethyl phosphate, dibutyl phosphate, dipropyl phosphate, diphenyl phosphate, isopropyl phosphate, diisopropyl phosphate, n-butyl phosphate, methyl phosphite, ethyl phosphite, propyl phosphite, butyl phosphite, phenyl phosphite, dimethyl phosphite, diethyl phosphite, dibutyl phosphite, dipropyl phosphite, diphenyl phosphite, isopropyl phosphite, diisopropyl phosphite, n-butyl phosphite, 2-ethylhexyl-hydroxyethylylene diphosphonate, adenosine triphosphoric acid, adenosine phosphoric acid, mono(2-methacryloyloxyethyl) acid phosphate, mono(2-acryloyloxyethyl) acid phosphate, di(2-methacryloyloxyethyl) acid phosphate, di(2-acryloyloxyethyl) acid phosphate, ethyl diethylphosphonoacetate, ethyl acid phosphate, butyl acid phosphate, butyl pyrophosphate, butoxyethyl acid phosphate, 2-ethylhexyl acid phosphate, oleyl acid phosphate, tetracosyl acid phosphate, diethylene glycol acid phosphate, (2-hydroxyethyl)methacrylate acid phosphate, and the like. These phosphorus compounds may be used alone or in combination of two or more.

The compounding ratio of the phosphorus compound (G) is preferably 10 parts or less by mass, more preferably, 0.1 to 5 parts by mass, with respect to 100 parts by mass of the glass frit (B). A phosphorus compound (G) compounding ratio of more than 10 parts by mass with respect to 100 parts by mass of the glass frit (B) is unfavorable, because it leads to deterioration in baking efficiency.

The black paste composition according to the present invention may contain an organic solvent for preparation of the carboxyl group-containing resin (A) and adjustment of the composition or for adjustment of the viscosity for application of the composition on a substrate or a carrier film. Typical examples thereof include ketones such as methylethylketone and cyclohexanone; aromatic hydrocarbons such as toluene, xylene, and tetramethylbenzene; glycol ethers such as cellosolve, methylcellosolve, carbitol, methylcarbitol, butylcarbitol, propylene glycol monomethylether, dipropylene glycol monomethylether, dipropylene glycol monoethylether, and triethylene glycol monoethylether; acetate esters such as ethyl acetate, butyl acetate, cellosolve acetate, butyl cellosolve acetate, carbitol acetate, butylcarbitol acetate, and propylene glycol monomethylether acetate; alcohols such as ethanol, propanol, ethylene glycol, propylene glycol, and terpineol; aliphatic hydrocarbons such as octane and decane; and petroleum solvents such as petroleum ether, petroleum naphtha, hydrogenated petroleum naphtha, and solvent naphtha, and these solvents may be used alone or in combination of two or more.

As described above, when boric acid (F) is added, it is desirable to use a hydrophobic solvent having a solubility of 20 g or less in 100 g of water at 25° C.

The black paste composition according to the present invention may contain additionally, as needed, other known common additives including thermal polymerization inhibitors such as hydroquinone, hydroquinone monomethylether, t-butylcatechol, pyrogallol, and phenothiazine; thickeners such as fine silica, organic bentonite, and montmorillonite; silicone-, fluorine-, and polymer-based and other antifoaming agents and/or leveling agents; and imidazole-, thiazole-, and triazole-based and other silane-coupling agents.

A tack-free coating film can be formed, for example, by adjusting the black paste composition according to the present invention described above with the organic solvent to a viscosity suitable for application, applying the composition on a substrate, for example, by a dip-coating, a flow-coating, roll-coating, bar-coating, screen-printing, or curtain-coating method, and drying the wet film, for example, at approximately 60 to 120° C. for about 5 to 40 minutes. Alternatively, such a tack-free coating film may be formed by laminating, on a substrate, a film previously formed by applying and drying the composition on a carrier film.

The absorbance of the dried coating film per 1 μm of film thickness is preferably 0.1 to 0.8, from the viewpoint of pattern-forming efficiency. An absorbance of less than 0.1 may unfavorably result in insufficient absorbance of the coating film, making imaging more difficult. Alternatively, an absorbance of more than 0.8 unfavorably results in deterioration in in-depth hardening efficiency, giving a pattern in the undercut state. It is possible to control the absorbance in the range of 0.1 to 0.8, by adjusting the addition amounts of the black pigment (C), the oxime-based photopolymerization initiator (E-1) and the phosphine oxide-based photopolymerization initiator (E-2) used in combination.

A black matrix pattern is formed by irradiating a high-energy ray through a patterned photomask on the film selectively in the contact mode (or in non-contact mode) and developing the unexposed region with a dilute aqueous alkaline solution (e.g., 0.3 to 3% aqueous sodium carbonate solution).

A direct image-forming apparatus (e.g., direct laser imaging device drawing an image with a laser directly with the CAD data from a computer) may be used as the exposure device for irradiation with the high-energy ray. The high-energy ray source is preferably a laser diode, gas laser, solid state laser, or the like emitting a laser beam having a maximum wavelength in the range of 350 to 420 nm, and particularly preferably a laser diode.

Examples of the direct image-forming apparatus include those manufactured by Orbotech Japan, Pentax, Hitachi Via Mechanics, Ball Semiconductor and others, and any apparatus may be used.

Alternatively, a conventional exposure device may be used, instead of the direct image-forming apparatus above. Examples of the light source include halogen lamp, high-pressure mercury lamp, laser beam, metal halide lamp, black lamp, electrodeless lamp, and the like.

For example, a spraying method or an immersion method is used for development. The developing solution favorably used is, for example, an aqueous metal alkaline solution containing sodium hydroxide, potassium hydroxide, sodium carbonate, potassium carbonate, or sodium silicate or an aqueous amine solution containing monoethanolamine, diethanolamine, triethanolamine, or tetramethylammonium hydroperoxide, in particular a dilute aqueous alkaline solution at a concentration of approximately 1.5 mass % or less, but is not limited thereto as long as the carboxyl groups of the carboxyl group-containing resin (A) in the composition are hydrolyzed and the unhardened region (unexposed region) removed. The substrate is preferably washed with water and neutralized with an acid, for removal of the undesirable developing solution after development.

A desired black matrix pattern can be formed by baking the substrate carrying a black matrix pattern after development at approximately 400 to 600° C. in air or under nitrogen atmosphere.

EXAMPLES

Hereinafter, the present invention will be described more specifically with reference to Examples and Comparative Examples, but it should be understood that the present invention is not limited to the following Examples.

Preparative Example 1

Preparation of Carboxyl Group-Containing Resin

In a flask equipped with a thermometer, a stirrer, a dropping funnel, and a reflux condenser, placed were methyl methacrylate and methacrylic acid at a molar ratio of 0.87:0.13; a solvent dipropylene glycol monomethylether and a catalyst azobisisobutylonitrile were added thereto; and the mixture was stirred under nitrogen atmosphere at 80° C. for 6 hours, to obtain a carboxyl group-containing resin solution. The resin had a weight-average molecular weight of approximately 10,000 and an acid value of 74 mg-KOH/g. The weight-average molecular weight of the copolymer resin obtained was determined by high-performance liquid chromatography, by using a pump LC-6AD manufactured by Shimadzu Corporation and three tandemly connected columns Shodex (R) KF-804, KF-803, and KF-802 manufactured by Showa Denko K.K. Co., Ltd. Hereinafter, the carboxyl group-containing resin solution will be referred to as varnish A-1.

Preparative Example 2

Preparation of Carboxyl Group-Containing Photosensitive Resin

In a flask equipped with a thermometer, a stirrer, a dropping funnel, and a reflux condenser, placed were methyl methacrylate and methacrylic acid at a molar ratio of 0.76:0.24; a solvent dipropylene glycol monomethylether and a catalyst azobisisobutylonitrile were added thereto; and the mixture was stirred under nitrogen atmosphere at 80° C. for 6 hours, to obtain a carboxyl group-containing resin solution. The carboxyl group-containing resin solution was cooled; in the presence of a polymerization inhibitor methylhydroquinone and a catalyst tetrabutylphosphonium bromide, glycidyl methacrylate was allowed to react in addition reaction to a molar ratio of 0.12 mole with respect to 1 mole of the resin carboxyl group at 95 to 105° C. over 16 hours; and the product was separated after the mixture was cooled. The carboxyl group-containing photosensitive resin obtained by the reaction had a weight-average molecular weight of approximately 10,000, an acid value of 59 mg-KOH/g, and a double bond equivalence of 950. Hereinafter, the carboxyl group-containing photosensitive resin solution will be referred to as varnish A-2.

Examples 1 to 7 and Comparative Example 1

Each of the compositions shown in Table 1 containing the varnish A-1 or A-2 obtained in the Preparative Examples was blended in a three-roll mill, to obtain a black paste composition.

TABLE 1

| Component | Ex. 1 | Ex. 2 | Ex. 3 | Ex. 4 | Ex. 5 | Ex. 6 | Ex. 7 | Comp. 1 |
|---|---|---|---|---|---|---|---|---|
| varnish A-1 | 100 | 100 | 100 | — | 100 | 100 | 100 | 100 |
| varnish A-2 | — | — | — | 100 | — | — | — | — |
| Glass frit(B)*1 | 20 | 20 | 20 | 20 | 20 | 20 | 20 | 20 |
| Black pigment(C)*2 | 50 | 50 | 50 | 50 | 50 | 50 | 50 | 50 |
| Polymerizable monomer(D)*3 | 50 | 50 | 50 | 50 | 50 | 50 | 50 | 50 |
| Photopolymerization initiator(E-1)*4 | 2 | 2 | 2 | 2 | 2 | 2 | 2 | — |
| Photopolymerization initiator(E-2)*5 | — | 30 | 30 | 30 | 30 | 30 | 30 | — |
| Photopolymerization initiator (Comp.)*6 | — | — | — | — | — | — | — | 10 |
| Boric acid (F)*7 | — | — | 0.1 | 0.1 | 0.1 | 0.1 | — | — |
| Phosphorus compound (G)*8 | — | — | — | — | — | 1 | 1 | — |

*1 Particles prepared by pulverizing a glass having a composition of 60% PbO, 20% $B_2O_3$, 15% $SiO_2$ and 5% $Al_2O_3$, a thermal expansion coefficient α300 of 70 × $10^{-7}$/° C., and a glass transition point of 445° C. to an average particle diameter of 1.6 μm.

*2 Slurry of black tricobalt tetroxide fine particles having a maximum particle diameter of 5 μm or less and an average particle diameter of 0.2 μm dispersed uniformly in tripropylene glycol monomethylether at a concentration of 70%.

*3 Pentaerythritol triacrylate

*4 2-(acetyloxyiminomethyl)thioxanthen-9-one

*5 2,4,6-trimethylbenzoyldiphenylphosphine oxide

*6 2-methyl-1-[4-(methylthio)phenyl]-2-morpholinopropan-1-one

*7 Particles prepared by pulverizing boric acid in a jet mill to an average particle diameter of 5 μm or less.

*8 2-methacryloyloxyethyl acid phosphate

[1] Each of the black paste compositions obtained in Examples 1 to 7 and Comparative Example 1 above was applied on the entire surface of a glass plate through a 300-mesh polyester screen. Then, the wet film was dried in a hot air-circulating drying oven at 90° C. for 20 minutes, to form a film favorable in finger-tip dryness. Subsequently, the film was exposed at an integrated light intensity on the composition of 40 mJ/cm$^2$ in a laser direct-imaging exposure device (DI-μ10, manufactured by Pentax) having a light source emitting a blue purple laser at a central wavelength of 405 nm, by using CAD data of a stripe-shaped image having a line width of 100 μm and a space width of 150 μm. The image was then developed with 0.4 mass % aqueous Na$_2$CO$_3$ solution at a liquid temperature of 30° C. for 20 seconds and then washed with water. The substrate was finally baked in an electric furnace in air.

The substrate was baked at a programmed heating rate of 5° C./minute from room temperature to 590° C. and at a constant temperature of 590° C. for 10 minutes, and then cooled to room temperature.

Results of evaluation on various properties of respective substrates thus obtained are summarized in Table 2.

The properties in Table 2 were evaluated respectively as follows:

(4) Line Shape after Patterning

The pattern formed with the alkali development-type black paste composition when exposed at the lowest exposure intensity was observed under a microscope after development, and the irregular fluctuation in shape, twisting, or the like of the line was evaluated, according to the following evaluation criteria:

O: No irregular fluctuation in shape, twisting, or the like
Δ: Some irregular fluctuation in shape, twisting, or the like
x: Significant irregular fluctuation in shape, twisting, or the like (5) Line Shape after Baking The line shape after baking was determined by evaluating the irregular fluctuation in shape, twisting or the like in the pattern after baking under a microscope, according to the following evaluation criteria:

O: No irregular fluctuation in shape, twisting, or the like
Δ: Some irregular fluctuation in shape, twisting, or the like
x: Significant irregular fluctuation in shape, twisting, or the like (6) Adhesiveness The adhesiveness of the pattern formed was evaluated on the basis of pattern separation in a peeling test using a cellophane adhesive tape, according to the following evaluation criteria:

TABLE 2

| Properties | Ex. 1 | Ex. 2 | Ex. 3 | Ex. 4 | Ex. 5 | Ex. 6 | Ex. 7 | Comp. 1 |
|---|---|---|---|---|---|---|---|---|
| (1) Absorbance | 0.41 | 0.39 | 0.37 | 0.38 | 0.36 | 0.38 | 0.38 | 0.4 |
| (2) Photosensitivity (laser) | o | o | o | o | o | o | o | x |
| (3) Lowest exposure intensity [mJ/cm$^2$] | 80 | 60 | 50 | 50 | 40 | 50 | 50 | 300 |
| (4) Line shape after patterning | o | o | o | o | o | o | o | — |
| (5) Line shape after baking | o | o | o | o | o | o | o | — |
| (6) Adhesiveness | o | o | o | o | o | o | o | — | o: No pattern separation
Δ: Some pattern separation
x: Significant pattern separartion (1) Measurement of Absorbance The absorbance of a test substrate carrying a coating film formed on a soda lime glass at a dry film thickness of 5 μm and 10 μm was determined by using an ultraviolet-visible spectrophotometer. The absorbance per 1 μm thickness at 405 nm was calculated from the data obtained.

(2) Evaluation of Photosensitivity (Laser)

A line image at a L/S ratio of 100/150 μm was exposed at an integrated light intensity of 50 mJ/cm$^2$; the resulting image was developed with 0.4 mass % aqueous Na$_2$CO$_3$ solution at a liquid temperature of 30° C. for 20 seconds; and the line formed was evaluated under an optical microscope, according to the following evaluation criteria:

O: No defect observed
Δ: Some defects observable
x: No line formed (3) Calculation of Lowest Exposure Intensity The minimum exposure intensity giving a line image at a L/S ratio of 100/150 μm without defect was determined, by repeated exposure while the integrated light intensity was changed. The sample obtained in Comparative Example was not practical because of its elongated laser exposure period needed, and thus, was not evaluated in the tests below.

As apparent from the results shown in Table 2, the black paste composition according to the present invention is sufficiently sensitive to laser beam and forms a high-definition pattern. In addition, there is no irregular fluctuation in the line shape after baking, and the pattern obtained had a favorable adhesiveness to the substrate.

The black paste composition was favorable in blackness after baking and also superior in storage stability.

[2] Subsequently, a pattern was formed also by using a high-pressure mercury lamp. Each of the black paste compositions obtained in Examples 1 to 7 and Comparative Example 1 was coated on the entire surface of a glass plate through a 300-mesh polyester screen. The wet film was then dried in a hot air-circulating drying oven at 90° C. for 20 minutes, to form a film favorable in finger-tip dryness. The film was then exposed at an integrated light intensity thereon of 50 mJ/cm$^2$ in an exposure device (MAT-5301, manufactured by Hakuto) having an ultrahigh-pressure mercury lamp as the light source, by using a dry glass plate carrying a stripe-shaped negative pattern having a line width of 100 μm and a space width of 150 μm as the photomask. The film was then developed with 0.4 mass % aqueous Na$_2$CO$_3$ solution at a liquid temperature of 30° C. for 20 seconds, then washed with water, and finally baked in an electric furnace in air.

The substrate was baked at a programmed heating rate of 5° C./minute from room temperature to 590° C. and at a constant temperature of 590° C. for 10 minutes, and then cooled to room temperature.

Results of evaluation on various properties of respective substrates thus obtained are summarized in Table 3.

The properties in Table 3 were evaluated respectively as follows:

(7) Evaluation of Photosensitivity (Lamp Exposure)

A line image at a L/S ratio of 100/150 μm was exposed at an integrated light intensity of 50 mJ/cm$^2$; the resulting image was developed with 0.4 mass % aqueous $Na_2CO_3$ solution at a liquid temperature of 30° C. for 20 seconds; and the line formed was evaluated under an optical microscope, according to the following evaluation criteria:

O: No defect observed
Δ: Some defects observable
x: No line formed (8) Calculation of Lowest Exposure Intensity The minimum exposure intensity giving a line image at a L/S ratio of 50/200 μm without defect was determined, by repeated exposure while the integrated light intensity was changed.

(9) Line Shape after Patterning

The pattern formed with the alkali development-type silver paste composition when exposed at the lowest exposure intensity was observed under a microscope after development, and the irregular fluctuation in shape, twisting, or the like of the line was evaluated, according to the following evaluation criteria:

O: No irregular fluctuation in shape, twisting, or the like
Δ: Some irregular fluctuation in shape, twisting, or the like
x: Significant irregular fluctuation in shape, twisting, or the like

(10) Line Shape after Baking

The line shape after baking was determined by evaluating the irregular fluctuation in shape, twisting or the like in the pattern after baking under a microscope, according to the following evaluation criteria:

O: No irregular fluctuation in shape, twisting, or the like
Δ: Some irregular fluctuation in shape, twisting, or the like
x: Significant irregular fluctuation in shape, twisting, or the like

(11) Adhesiveness

The adhesiveness of the pattern formed was evaluated on the basis of pattern separation in a peeling test using a cellophane adhesive tape, according to the following evaluation criteria:

As apparent from the results in Table 3, the alkali development-type black paste composition according to the present invention is sufficiently sensitive and forms a high-definition pattern even when a high-pressure mercury lamp is used as the light source. Since the composition is made drastically improved in sensitivity, it also allows significant shortening of the exposure period, when it is processed by conventional lamp exposure. The pattern obtained after baking is also free from irregular fluctuation in line shape, has a favorable adhesiveness to the substrate, and is thus superior in storage stability. In addition, without regard to the type of the exposure methods, the black paste composition was favorable in blackness after baking.

What is claimed is:

1. An alkali development-type black paste composition, comprising (A) a carboxyl group-containing resin, (B) a glass frit, (C) a black pigment, (D) a compound having at least one radically polymerizable unsaturated group in its molecule, and (E-1) an oxime-based photopolymerization initiator represented by the following general formula (I):

[Formula 1]

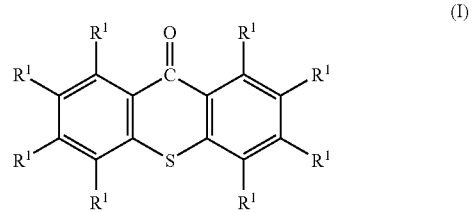

where one or two $R^1$s are represented by the following general formula (II), and each of the other $R^1$s represents a hydrogen or halogen atom or a methyl, ethyl, or phenyl group,

[Formula 2]

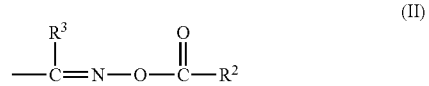

where $R^2$ represents a hydrogen atom, an alkyl group having 1 to 6 carbon atoms, or a phenyl group; and $R^3$ represents a hydrogen atom or an alkyl group having 1 to 6 carbon atoms.

TABLE 3

| Properties | Ex. 1 | Ex. 2 | Ex. 3 | Ex. 4 | Ex. 5 | Ex. 6 | Ex. 7 | Comp. 1 |
|---|---|---|---|---|---|---|---|---|
| (7) Photosensitivity (lamp exposure) | o | o | o | o | o | o | o | x |
| (8) Lowest exposure intensity [mJ/cm$^2$] | 50 | 50 | 40 | 40 | 30 | 40 | 40 | 300 |
| (9) Line shape after patterning | o | o | o | o | o | o | o | o |
| (10) Line shape after baking | o | o | o | o | o | o | o | o |
| (11) Adhesiveness | o | o | o | o | o | o | o | o | o: No pattern separation
Δ: Some pattern separation
x: Significant pattern separartion 2. The alkali development-type black paste composition according to claim 1, wherein the carboxyl group-containing resin (A) is (A') a carboxyl group-containing photosensitive resin having one or more radically polymerizable unsaturated groups.

3. The alkali development-type black paste composition according to claim 1, further comprising (E-2) a phosphine oxide-based photopolymerization initiator having a structure represented by the following general formula (III):

[Formula 3]

where $R^4$ and $R^5$ each independently represent a linear or branched alkyl group having 1 to 6 carbon atoms, a cyclohexyl group, a cyclopentyl group, an aryl group, a halogen atom, an aryl group substituted with an alkyl or alkoxy group, or a carbonyl group having 1 to 20 carbon atoms, with the proviso that $R^4$ and $R^5$ are not carbonyl groups having 1 to 20 carbon atoms at the same time.

4. The alkali development-type black paste composition according to claim 3, wherein the compounding ratio of the oxime-based photopolymerization initiator (E-1) represented by general formula (I) is smaller than that of the phosphine oxide-based photopolymerization initiator (E-2) represented by general formula (III).

5. The alkali development-type black paste composition according to claim 3, further comprising (F) a boric acid.

6. The alkali development-type black paste composition according to claim 3, further comprising (G) a phosphorus compound having a structure represented by either of the following formulae (IV) and (V):

[Formula 4]

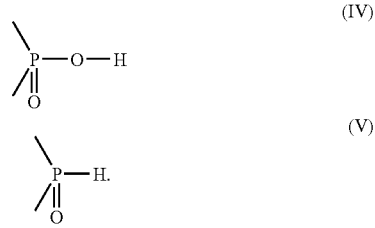

7. The alkali development-type black paste composition according to claim 3, wherein absorbance per 1 μm thickness of a coating film obtained by diluting the composition with an organic solvent and coating and drying the solution is 0.1 to 0.8.

8. A method of forming a black matrix pattern using the composition according to claim 3, comprising:
   a step (1) of drawing a pattern by using a light source emitting a laser having a maximum wavelength of 350 to 420 nm;
   a step (2) of forming a pattern selectively by developing the pattern with a dilute aqueous alkaline solution; and
   a step (3) of baking the pattern at 400 to 600° C.

9. A black matrix pattern formed with the composition according to claim 3, by the process comprising the following steps:
   (1) drawing a pattern by using light source emitting a laser having a maximum wavelength of 350 to 420 nm;
   (2) selectively forming a pattern by development with a dilute aqueous alkaline solution; and
   (3) baking the pattern at 400 to 600° C.

10. A plasma display panel, comprising a black matrix pattern formed with the black paste composition according to claim 3.

11. The alkali development-type black paste composition according to claim 1, further comprising (F) a boric acid.

12. The alkali development-type black paste composition according to claim 1, further comprising (G) a phosphorus compound having a structure represented by either of the following formulae (IV) and (V):

[Formula 4]

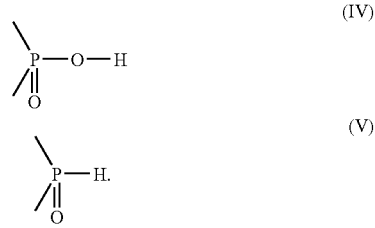

13. The alkali development-type black paste composition according to claim 1, wherein absorbance per 1 μm thickness of a coating film obtained by diluting the composition with an organic solvent and coating and drying the solution is 0.1 to 0.8.

14. A method of forming a black matrix pattern using the composition according to claim 1, comprising:
   a step (1) of drawing a pattern by using a light source emitting a laser having a maximum wavelength of 350 to 420 nm;
   a step (2) of forming a pattern selectively by developing the pattern with a dilute aqueous alkaline solution; and
   a step (3) of baking the pattern at 400 to 600° C.

15. A black matrix pattern formed with the composition according to claim 1, by the process comprising the following steps:
   (1) drawing a pattern by using a light source emitting a laser having a maximum wavelength of 350 to 420 nm;
   (2) selectively forming a pattern by development with a dilute aqueous alkaline solution; and
   (3) baking the pattern at 400 to 600° C.

16. A plasma display panel, comprising a black matrix pattern formed with the black paste composition according to claim 1.

* * * * *